(12) United States Patent
Hu et al.

(10) Patent No.: US 11,963,431 B2
(45) Date of Patent: Apr. 16, 2024

(54) MASK, FLEXIBLE DISPLAY PANEL AND MANUFACTURING METHOD THEREOF (71) Applicants: Chengdu BOE Optoelectronics Technology Co., Ltd., Sichuan (CN); BOE TECHNOLOGY GROUP CO., LTD., Beijing (CN)

(72) Inventors: Qian Hu, Beijing (CN); Yuqing Yang, Beijing (CN); Fan Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 706 days.

(21) Appl. No.: 17/042,140

(22) PCT Filed: Dec. 24, 2019

(86) PCT No.: PCT/CN2019/127852
§ 371 (c)(1),
(2) Date: Sep. 27, 2020

(87) PCT Pub. No.: WO2020/155942
PCT Pub. Date: Aug. 6, 2020

(65) Prior Publication Data
US 2021/0020873 A1    Jan. 21, 2021

(30) Foreign Application Priority Data
Jan. 30, 2019 (CN) .......................... 201910092372.4

(51) Int. Cl.
*H10K 71/00* (2023.01)
*G03F 1/38* (2012.01)
*H10K 102/00* (2023.01)

(52) U.S. Cl.
CPC ............... *H10K 71/00* (2023.02); *G03F 1/38* (2013.01); *H10K 2102/311* (2023.02)

(58) Field of Classification Search
None
See application file for complete search history.

(56) References Cited

U.S. PATENT DOCUMENTS

2016/0141587 A1    5/2016  Suh et al.
2019/0267440 A1*   8/2019  Park ..................... H10K 59/131
(Continued)

FOREIGN PATENT DOCUMENTS

CN    104035274 A    9/2014
CN    204374608 U    6/2015
(Continued)

OTHER PUBLICATIONS

China Patent Office, Second Office Action dated Apr. 23, 2021 regarding CN201910092372.4 and the English translation thereof.
(Continued)

*Primary Examiner* — J. E. Schoenholtz
(74) *Attorney, Agent, or Firm* — HOUTTEMAN LAW LLC (57) ABSTRACT A mask for forming a trench in a flexible bendable region of a flexible display panel is provided. The mask includes a first region, a second region, and a third region sandwiched between the first and second regions in a first direction, and the third region has the same pattern as a pattern of a trench to be formed. Light transmission properties of the first and second regions are the same as each other, but are opposite to a light transmission property of the third region. An edge of at least one of the first and second regions proximal to the third region has a plurality of protrusions, and each of the plurality of protrusions has a vertex angle that is at a side proximal to the third region and is not more than 90°. A (Continued)

flexible display panel and a manufacturing method thereof are further provided.

13 Claims, 8 Drawing Sheets

(56) References Cited

U.S. PATENT DOCUMENTS

2020/0119131 A1* 4/2020 Ohara .................. G09F 9/30
2021/0057500 A1* 2/2021 Saitoh ................ H10K 59/124

FOREIGN PATENT DOCUMENTS

| CN | 105511221 A | 4/2016 |
| CN | 106449695 A | 2/2017 |
| CN | 206133181 U | 4/2017 |
| CN | 107247386 A | 10/2017 |
| CN | 107978612 A | 5/2018 |
| CN | 108054188 A | 5/2018 |
| CN | 108288637 A | 7/2018 |

OTHER PUBLICATIONS

China Patent Office, First Office Action dated Jan. 22, 2021 regarding CN201910092372.4 and the English translation thereof.

* cited by examiner

MASK, FLEXIBLE DISPLAY PANEL AND MANUFACTURING METHOD THEREOF

CROSS REFERENCE TO RELATED APPLICATIONS

This is a National Phase Application filed under 35 U.S.C. 371 as a national stage of PCT/CN2019/127852 filed on Dec. 24, 2019, as application claiming the priority of Chinese patent application No. 201910092372.4, filed on Jan. 30, 2019, the entire contents of which are incorporated herein by reference in their entirety.

TECHNICAL FIELD

The present disclosure relates generally to the field of display technologies. More particularly, the present disclosure relates to a mask, a flexible display panel, and a method for manufacturing the flexible display panel.

BACKGROUND

A technology of organic light emitting diode (OLED) display is a technology for realizing display by using a reversible change in color of an organic functional material driven by an electric current. The OLED display is considered to be one of the most promising display technologies due to its advantages of ultra-light weight, ultra-thin thickness, high brightness, large viewing angle, low voltage, low power consumption, fast response, high definition, shock resistance, flexibility, low cost, simple manufacturing process, low consumption of raw materials, high light emitting efficiency, wide operating temperature range, and the like.

In the OLED display technology, an active matrix OLED (AMOLED) display technology has advantages of self-luminescence, wide viewing angle, high contrast, fast response speed, and the like, and thus has a higher refresh rate and significantly lower power consumption than a passive matrix OLED (PMOLED) display technology, which makes AMOLEDs well suitable for operation in portable electronic devices that are sensitive to power consumption.

On the basis of an AMOLED display panel, a flexible AMOLED display panel realizes a certain flexibility by employing a flexible substrate, and may even be folded and/or rolled like paper, such that the understanding of people on a traditional display panel is thoroughly subverted, and the flexible AMOLED display panel is one of hot spots in the field of display technologies at present.

SUMMARY

A first aspect of the present disclosure provides a mask configured to form a trench in a flexible bendable region of a flexible display panel. The mask includes a first region, a second region, and a third region sandwiched between the first region and the second region in a first direction, and the third region has the same pattern as a pattern of a trench to be formed. A light transmission property of the first region and a light transmission property of the second region are the same as each other, but are opposite to a light transmission property of the third region. An edge of at least one of the first region and the second region proximal to the third region has a plurality of protrusions, and each of the plurality of protrusions has a vertex angle that is at a side proximal to the third region and is not more than 90°.

When the mask with the above configuration is employed to form one of the first trench and the second trench in the bendable region of the flexible display panel, a slope angle of a step formed at a junction of the first trench and the second trench is far smaller than 60° due to the presence of the protrusions, and thus even if a source-drain metal material is remained on the step, the remained source-drain metal material is disconnected at a corner of the step because the slope angle of the step is far smaller than 60°, thereby at least avoiding short-circuit between adjacent data lines due to the source-drain metal residue, and improving the display effect of the display panel.

According to an exemplary embodiment of the present disclosure, a shape of each of the plurality of protrusions is selected from a group consisting of a triangle, a trapezoid, and a quadrilateral.

According to an exemplary embodiment of the present disclosure, a size of each of the plurality of protrusions in the first direction is not more than 10 microns.

According to an exemplary embodiment of the present disclosure, the flexible display panel has a plurality of data lines extending along the first direction, and a maximum size of each of the plurality of protrusions in a second direction perpendicular to the first direction is not greater than a distance between adjacent two of the plurality of data lines.

According to an exemplary embodiment of the present disclosure, the edge of each of the first region and the second region proximal to the third region has the plurality of protrusions, and each protrusion of the first region and a corresponding protrusion of the second region are exactly opposite to each other in the first direction.

A second aspect of the present disclosure provides a method for manufacturing a flexible display panel. The flexible display panel includes a display region and a flexible bendable region outside the display region. The method including: forming a buffer layer on a substrate; forming an insulating layer on a side of the buffer layer distal to the substrate; etching a portion of the insulating layer away in the flexible bendable region by using a first mask to form a first trench; etching a portion of the buffer layer away in the first trench by using a second mask to form a second trench; and forming a source-drain metal layer on a side of the insulating layer distal to the buffer layer. The source-drain metal layer covers the first trench and the second trench. At least one of the first mask and the second mask is the mask according to any one of the embodiments of the first aspect.

When the above method is used for manufacturing a flexible display panel, a slope angle of the formed step is far smaller than 60° due to the presence of the protrusions in the mask, and thus even if the source-drain metal material is remained on the step of the trenches after being patterned, the remained source-drain metal material is disconnected at a corner of the step because the slope angle of the step is far smaller than 60°, thereby at least avoiding short-circuit between adjacent data lines due to the source-drain metal residue, and improving the display effect of the display panel.

According to an exemplary embodiment of the present disclosure, both of the first mask and the second mask are the masks according to any one of the embodiments of the first aspect, and a size of the third region of the first mask in the first direction is greater than a size of the third region of the second mask in the first direction.

According to an exemplary embodiment of the present disclosure, in the first direction, a minimum size of the first trench is greater than a maximum size of the second trench.

A third aspects of the present disclosure provide a flexible display panel manufactured by using the method for manufacturing a flexible display panel according to any one of the embodiments of the second aspect. The flexible display panel includes a display region and a flexible bendable region outside the display region, and the flexible display panel includes: a substrate; a buffer layer on the substrate; an insulating layer on a side of the buffer layer distal to the substrate; a first trench in the insulating layer and in the flexible bendable region; and a second trench in the buffer layer and in the first trench.

In the flexible display panel, a slope angle of the formed step is far smaller than 60° due to the presence of the protrusions of the employed mask(s), and thus even if the source-drain metal material is remained on the step of the trenches after being patterned, the remained source-drain metal material is disconnected at a corner of the step because the slope angle of the step is far smaller than 60°, thereby at least avoiding short-circuit between adjacent data lines due to the source-drain metal residue, and improving the display effect of the display panel.

According to an exemplary embodiment of the present disclosure, in the first direction, a minimum size of the first trench is greater than a maximum size of the second trench.

It should be understood that the aspects in accordance with the present disclosure have the same or similar features and embodiments. The foregoing general description and the following detailed description are exemplary and explanatory only and are not intended to limit the disclosure in any way.

BRIEF DESCRIPTION OF THE DRAWINGS

To more clearly explain technical solutions according to embodiments of the present disclosure, drawings used in the description of the embodiments will be briefly introduced below. It is apparent that the drawings described below are only some embodiments of the present disclosure.

FIG. 1(a) schematically illustrates a top view of a flexible display panel, and FIG. 1(b) schematically illustrates a side view of the flexible display panel as illustrated in FIG. 1(a) in a bent state.

Exemplary embodiments of the present disclosure have been shown through the above-described drawings and will be described in more detail below. The drawings and the following description are not intended to limit the scope of the present inventive concept in any way, but rather to explain the present inventive concept to one of ordinary skill in the art by reference to exemplary embodiments.

DETAILED DESCRIPTION

To make the objects, technical solutions and advantages of embodiments of the present disclosure more apparent, the technical solutions of the embodiments of the present disclosure will be described in further detail below with reference to the accompanying drawings.

Figures 1A, 1B:
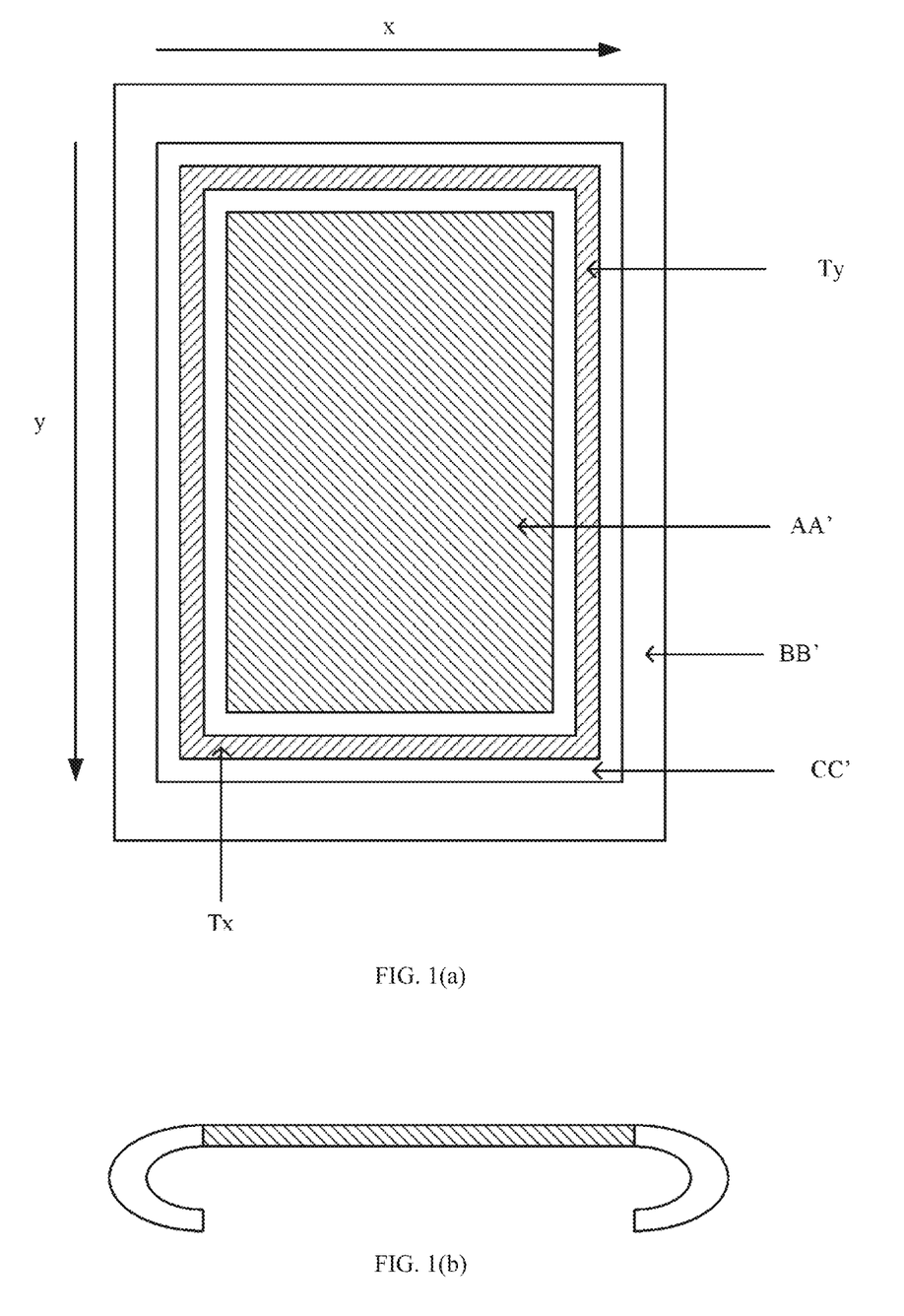

FIG. 1(a) schematically illustrates a top view of a flexible display panel. As shown in FIG. 1(a), the flexible display panel includes a display region AA', a non-display region BB' surrounding the display region AA', and a bendable region CC' disposed between the display region AA' and the non-display region BB'. The bendable region CC' has a trench Tx extending in an x direction and a trench Ty extending in a y direction formed therein. Gate lines and data lines (not shown in the figure) extend in the x and y directions in the display region AA', respectively, and extend to the non-display region BB' through the trenches Ty and Tx, respectively. In particular, the non-display region BB' may be bent to the back of the display panel through the bendable region CC' as shown in FIG. 1(b), so as to achieve the effect of no border on a display surface of the display panel, thereby improving the display quality. The trenches Ty and Tx provide necessary buffering for the gate lines and the data lines, respectively, such that the gate lines and the data lines do not break when the flexible display panel is bent.

Figure 2:
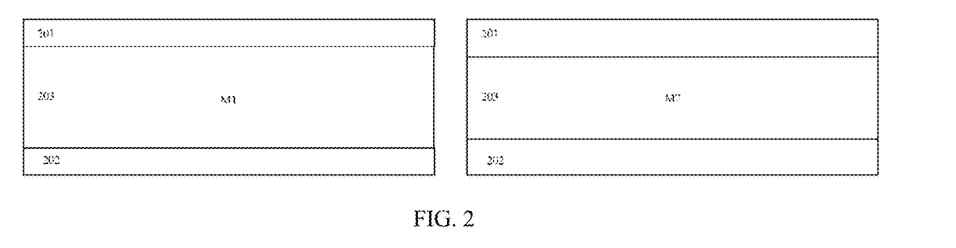
FIG. 2 schematically illustrates a top view of a conventional mask.
Figure 3A:
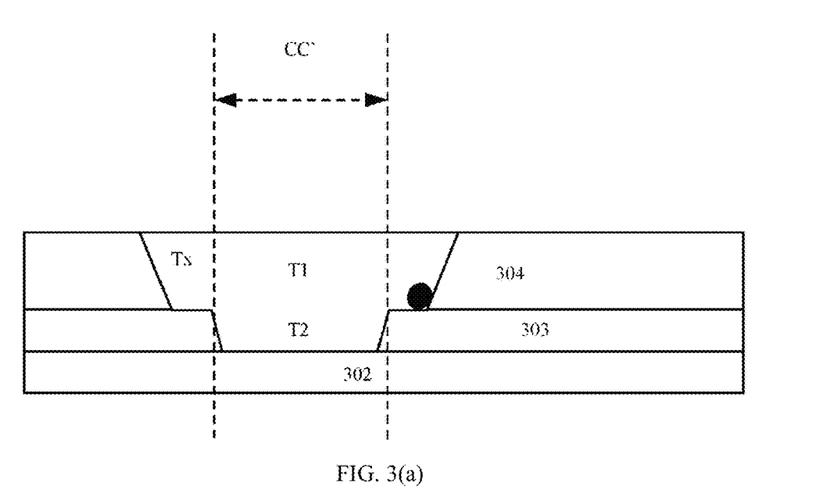
FIG. 3(a) schematically illustrates a cross-sectional view of a trench formed by using the mask shown in FIG. 2, and FIGS. 3(b) to 3(d) are schematic electron micrographs respectively illustrating phenomena of source-drain metal residue caused by the use of the mask shown in FIG. 2.

In a specific implementation, the trenches Tx and Ty may be formed by a photolithography process. FIG. 2 schematically illustrates a top view of a conventional mask used for forming the trenches, and FIG. 3(a) schematically illustrates a cross-sectional view of a trench formed by using the conventional mask as shown in FIG. 2. Taking the trench Tx as an example, as shown in FIG. 2, the mask for forming the trench Tx includes a first conventional mask M1 and a second conventional mask M2 that have a similar pattern. The pattern includes a first region 201 and a second region 202 oppositely arranged in the y direction as shown in FIG. 1(a), and a third region 203 sandwiched between the first region 201 and the second region 202, a pattern of the third region 203 being the same as that of the trench to be formed. It should be noted that the sizes (or dimensions) of the first, second and third regions shown in FIG. 2 are merely illustrative and do not imply actual relative dimensional relationships between the first, second and third regions. In practical applications, the mask shown in FIG. 2 may be a part of a mask with a larger size for manufacturing a flexible display panel, and in such a case, the first region and the second region may include patterns corresponding to other parts of the flexible display panel, which is not described herein in detail. In particular, a light transmission property of the first region 201 and a light transmission property the second region 202 are the same as each other, but are opposite to a light transmission property of the third region 203, so as to form a trench in cooperation with a corresponding photoresist. Specifically, as shown in FIG. 3(a), the trench Tx is formed in a buffer layer 303 and an insulating layer 304 on a base substrate 302 through two photolithography processes, in which a first photolithography process employs the first conventional mask M1 to form a wider first trench T1 in the insulating layer 304, and a second photolithography process employs a second conventional mask M2 to form a narrower second trench T2 in a portion of the buffer layer 303 exposed in the first trench T1. The first trench T1 has a larger size than the second trench T2 in the y direction, and correspondingly, a size of the third region 203 of the first conventional mask M1 is larger than a size of the third region 203 of the second conventional mask M2 in the y direction. Due to a difference between the sizes of the first and second trenches T1 and T2, a step is formed at a position where the first and second trenches T1 and T2 are connected to each other. It should be noted that the trench Ty have a similar structure to that of the trench Tx, such that a mask used for forming the trench Ty likewise includes a first conventional mask and a second conventional mask that have a similar pattern, the first conventional mask is used for forming a first trench of the trench Ty, and the second conventional mask is used for forming a second trench of the trench Ty.

The present inventors have realized that when the mask shown in FIG. 2 is used for forming a trench in a bendable region of an AMOLED flexible display panel, since a thickness of an organic layer of the AMOLED flexible display panel is large, the required depth of the trench is correspondingly large, for example, the depth of the trench may reach 1.65 microns. Therefore, when data lines are formed by a subsequent patterning process after the trench is formed, source-drain metal residue is likely to occur at the step formed at a position where the first trench and the second trench are connected to each other due to the limitation of an etching accuracy, as shown in FIG. 3(a), in which a black spot at a junction of the trenches T1 and T2 schematically represents the source-drain metal residue. The source-drain metal remaining between the data lines will cause short-circuit to occur between adjacent data lines, resulting in a defect of concealed wiring in a direction of the data lines. The present inventors have found that in an electrical test on the manufactured display panel, a defect rate of concealed wiring in the direction of the data lines is about 4% to 8%. Further, according to a result of failure analysis, 50% of the defect of concealed wiring is caused by the source-drain metal residue at the step.

Figure 3B:
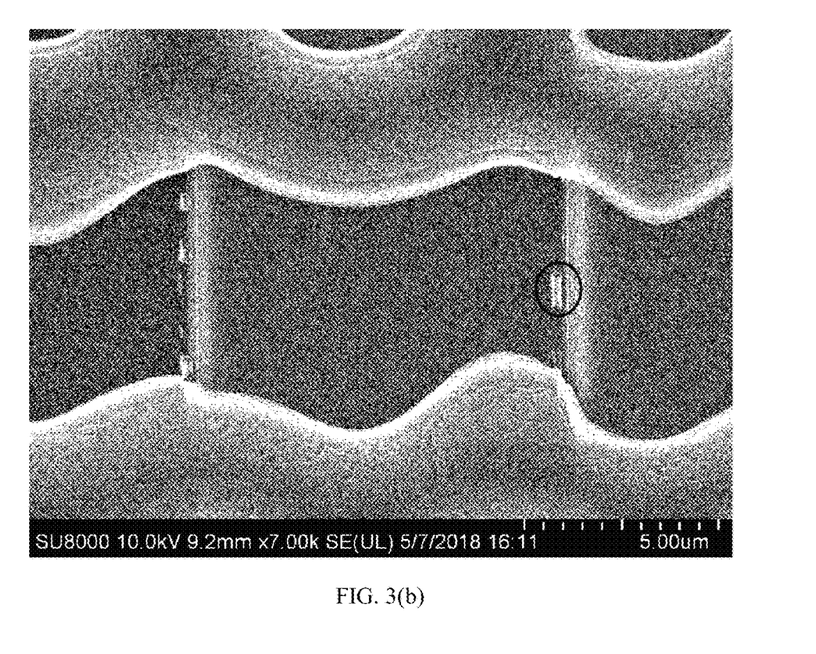
Figure 3C:
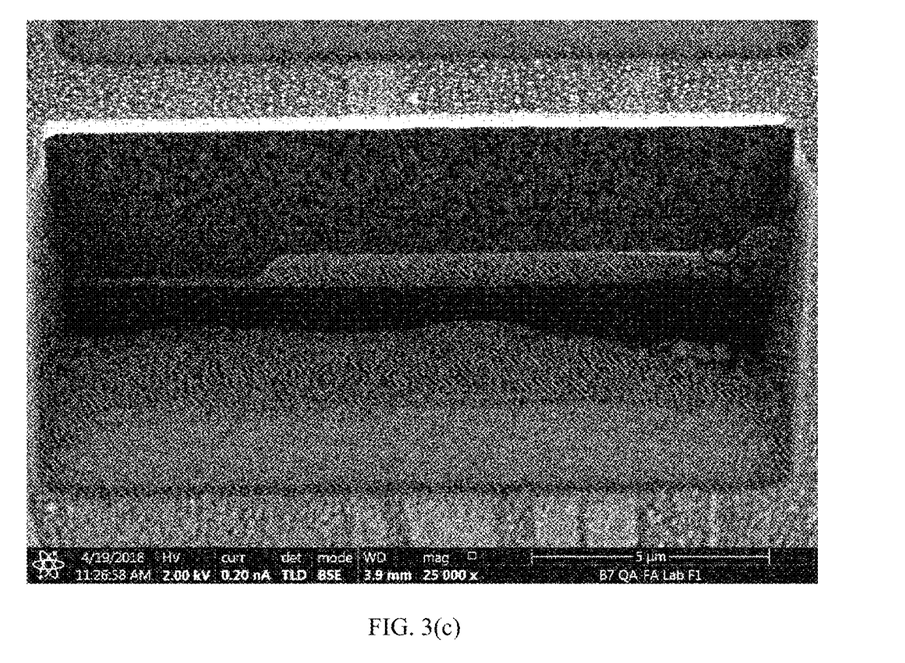
Figure 3D:
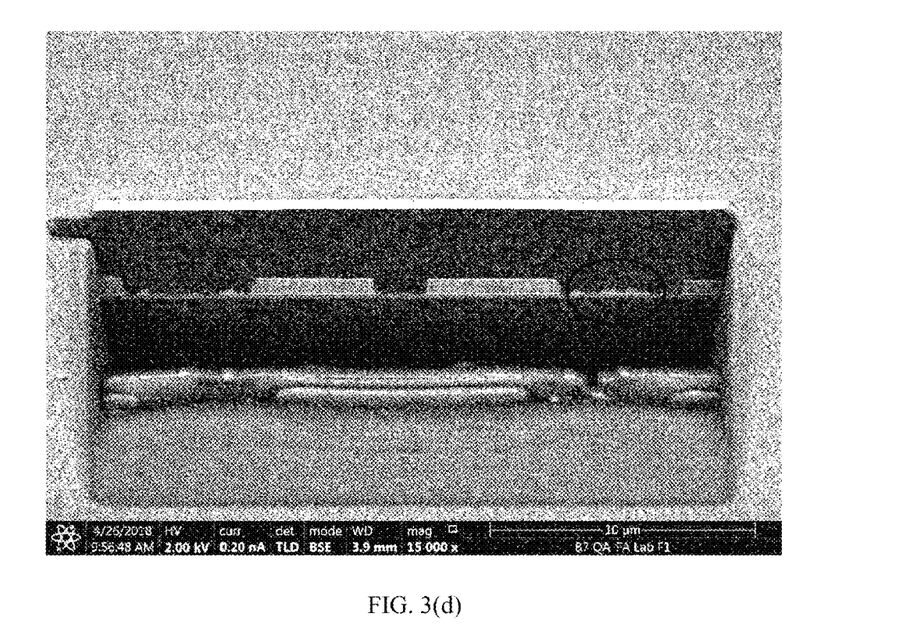

FIGS. 3(b) to 3(d) respectively illustrate the actual situation of the source-drain metal residue at the step in the electron micrographs, in which FIG. 3(b) is a top view, FIG. 3(c) is a cross-sectional view along the direction of the data lines, FIG. 3(d) is a cross-sectional view along a direction perpendicular to the direction of the data lines, and the circled portion is the residual source-drain metal.

The present inventors have further found that a slope angle formed after etching by using the first conventional mask and the second conventional mask as shown in FIG. 2 is about 60°, and the slope angle makes the source-drain metal easily remain at the step. Further, due to the limitation of process conditions, the residue may not be eliminated by simply increasing a time during which the source-drain metal is etched, and an excessively long etching time may increase the risk of loss of an interlayer dielectric layer, which may in turn affect the yield of the display panel.

Figure 4:
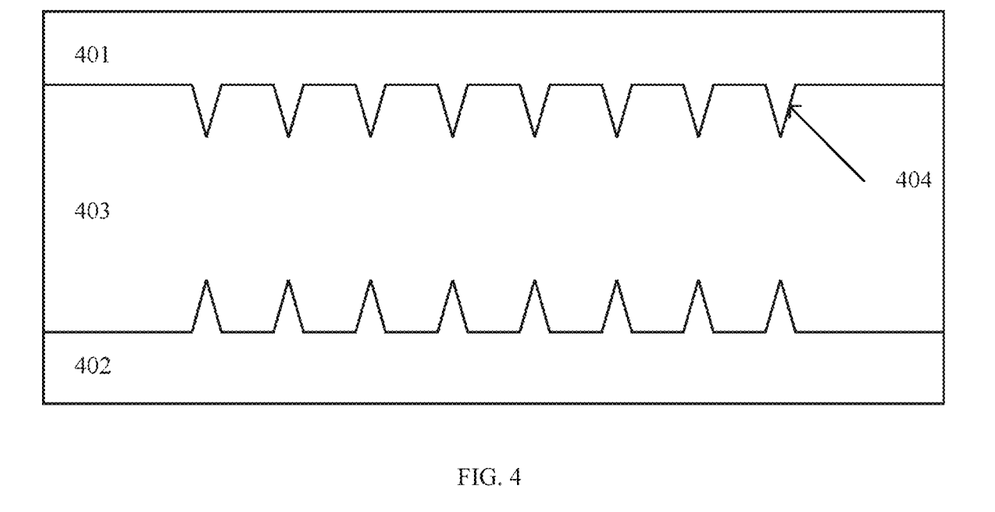
FIG. 4 schematically illustrates a top view of a mask according to an embodiment of the present disclosure.

In view of the above, an embodiment of the present disclosure provides a mask for forming the trench Tx or Ty of the flexible display panel as shown in FIG. 1. As shown in FIG. 4, the mask includes a first region 401, a second region 402, and a third region 403 sandwiched between the first region 401 and the second region 402 in a first direction. A light transmission property of the first region 401 and a light transmission property of the second region 402 are the same as each other, but are opposite to a light transmission property of the third region 403. It should also be noted that the sizes (or dimensions) of the first, second and third regions shown in FIG. 4 are merely illustrative and do not imply actual relative dimensional relationships of the first, second and third regions. In practical applications, the mask shown in FIG. 4 may be a part of a mask with a larger size for manufacturing a flexible display panel, and in such a case, the first region and the second region may include patterns corresponding to other parts of the flexible display panel, which is not described herein in detail. In an example, the first region 401 and the second region 402 may be lightproof (or opaque) whereas the third region 403 is light transmissive (or transparent), such that the mask may cooperate with a positive photoresist. Alternatively, the first region 401 and the second region 402 may be light transmissive whereas the third region 403 may be lightproof, such that the mask may cooperate with a negative photoresist. A pattern of the third region 403 corresponds to (e.g., matches to) a pattern of the trench to be formed. In particular, as shown in FIG. 4, an edge of each of the first region 401 and the second region 402 proximal to the third region 403 have a plurality of protrusions 404, and each of the protrusions 404 has a vertex angle that is at a side proximal to the third region 403 and is not more than 90°.

When the mask shown in FIG. 4 is employed to form the trench Tx or Ty of the flexible display panel shown in FIG. 1, the mask may be employed to form any one of the first and second trenches of the trench Tx or Ty by a patterning process. Alternatively, two masks as shown in FIG. 4 may be employed to form the first trench and the second trench by patterning processes, respectively. As used herein, the "first direction" refers to a direction perpendicular to an extending direction of the trench to be formed. Taking FIG. 1 as an example, the first direction of the mask for forming the trench Tx is the y direction, and the first direction of the mask for forming the trench Ty is the x direction.

When the mask with the above configuration is employed to form one of the first trench and the second trench in the bendable region of the flexible display panel as shown in FIG. 3(a), due to the presence of the protrusions 404, the slope angle of the step at the junction of the formed first and second trenches is far smaller than 60°, such that even if the source-drain metal material is remained on the step, the remained (or residual) source-drain metal material will be disconnected at a corner of the step due to the fact that the slope angle of the step is far smaller than 60°. Thus, the short-circuit between adjacent data lines due to the remained source-drain metal is avoided, and the display effect of the display panel is improved.

It should be noted that although in the mask shown in FIG. 4, both the first region 401 and the second region 402 have the protrusions 404, the present disclosure is not limited thereto. Alternatively, in other exemplary embodiments, the protrusions 404 may be disposed only at an edge of one of the first and second regions 401 and 402 proximal to the third region 403, which may also reduce an amount of the source-drain metal material remaining on the step to a certain extent, thereby reducing a probability of short-circuit between adjacent data lines.

As shown in FIG. 4, each of the protrusions 404 may have a shape of a triangle. Alternatively, in other exemplary embodiments, each protrusion 404 may have other shapes, such as a trapezoid, a quadrilateral, a regular or irregular polygon, and the like, as long as the protrusion 404 has a vertex angle that is at the side proximal to the third region 403 and is not greater than 90°.

In some exemplary embodiments, a size of each of the protrusions 404 in the first direction is not greater than 10 microns such that, on one hand, it is ensured that the third region 403 may form a trench with a sufficient size for bending the non-display region around the display panel to the back side of a main display surface of the display panel, and on the other hand, the source-drain metal remaining at the step of the trenches is prevented from causing short-circuit to occur between adjacent data lines.

The mask may be employed to form a groove (e.g., a trench) in the flexible display panel, and a plurality of data lines extending in a D-D' direction may be formed on the display panel in a subsequent manufacturing process. In order to further effectively avoid occurrence of short-circuit between adjacent data lines due to the source-drain metal remaining at the step of the trenches, the maximum size of each of the protrusions 404 of the mask in a second direction perpendicular to the first direction may be not greater than a distance between two adjacent data lines.

In a case where each of the first region 401 and the second region 402 has the protrusions 404, as shown in FIG. 4, each protrusion 404 of the first region 401 and a corresponding protrusion 404 of the second region 402 are exactly opposite to each other (i.e., exactly overlap each other) in the first direction.

Figure 5:
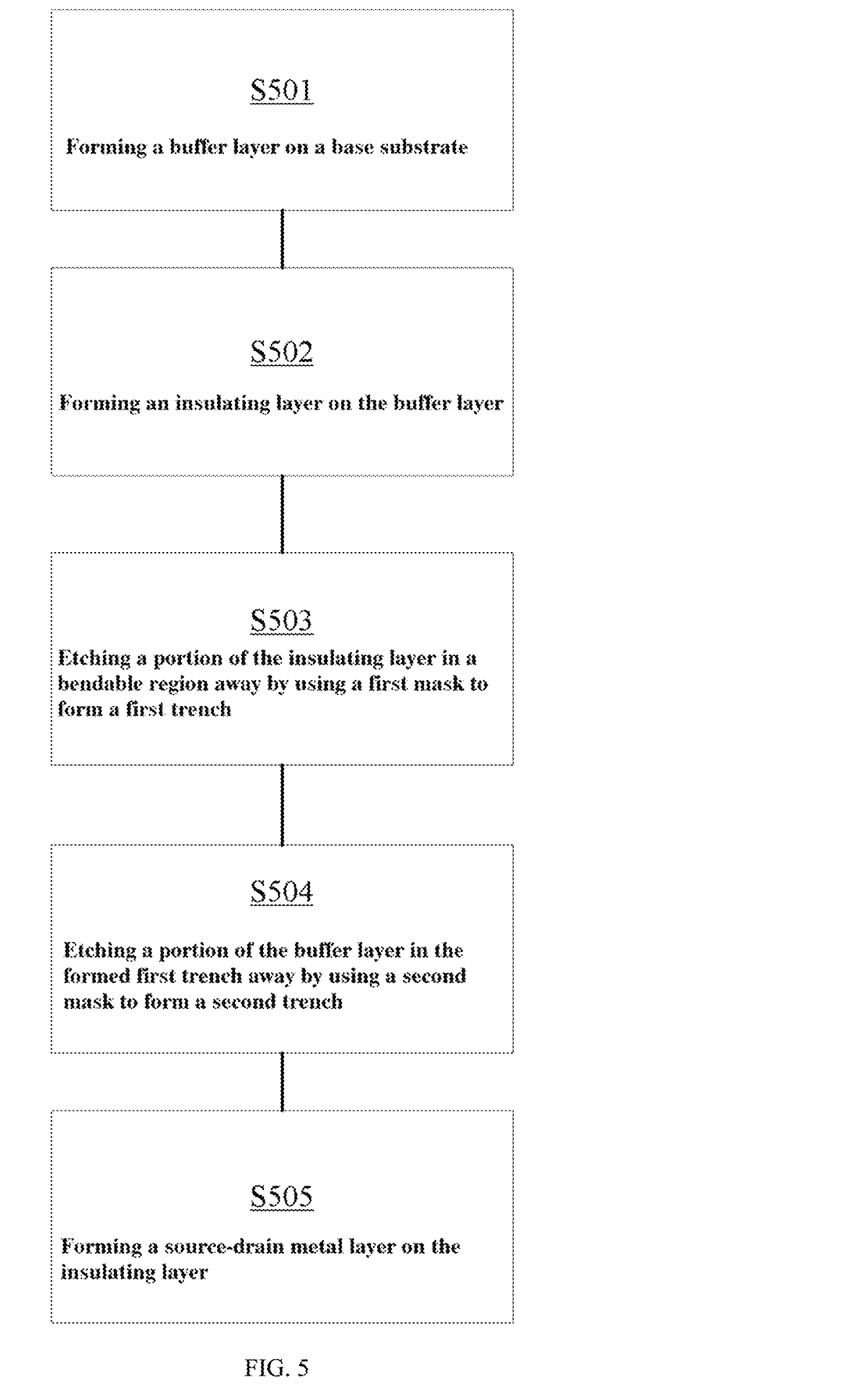
FIG. 5 schematically illustrates a flowchart of a method for manufacturing a flexible display panel according to an embodiment of the present disclosure.
Figure 6A:
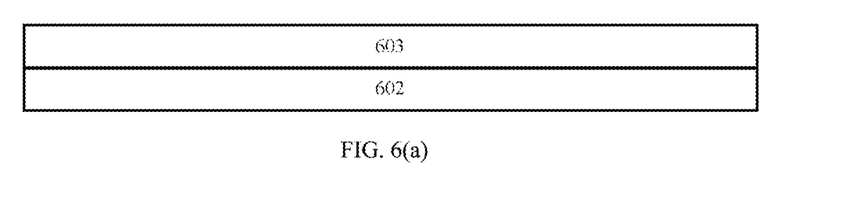
FIGS. 6(a) to 6(e) schematically illustrate cross-sectional views of respective steps of the method shown in FIG. 5.
Figure 6B:
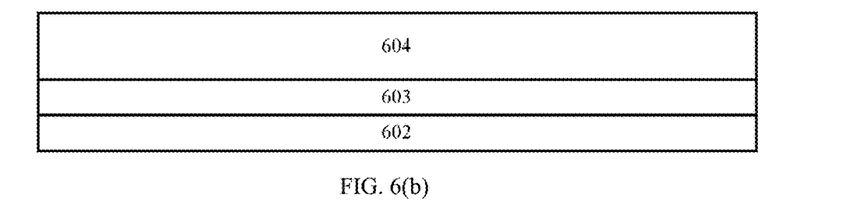
Figure 6C:
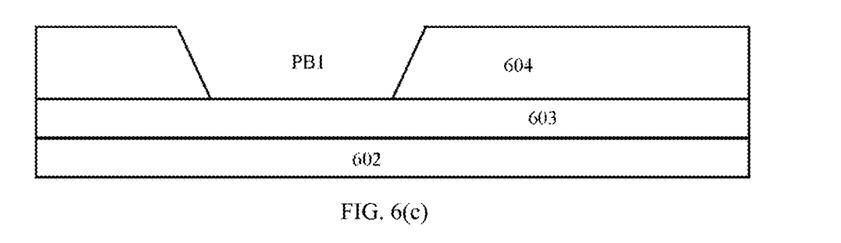

FIG. 5 illustrates a flowchart of a method for manufacturing a flexible display panel by using the mask as illustrated in FIG. 4, and FIGS. 6(a) to 6(e) schematically illustrate cross-sectional views corresponding to respective steps of the method as illustrated in FIG. 5. Specifically, the flexible display panel includes a display region and a flexible bendable region positioned outside the display region, and the mask is used for forming a groove (e.g., a trench) at the flexible bendable region. At step S501, as shown in FIG. 6(a), a buffer layer 603 is formed on a base substrate 602. The buffer layer 603 may be made of any commonly known organic or inorganic material. Next, at step S502, as shown in FIG. 6(b), an insulating layer 604 is formed on the buffer layer 603. The insulating layer 604 may be made of any insulating material commonly known, such as $SiO_2$, $Si_3N_4$, and/or the like. At step S503, as shown in FIG. 6(c), a portion of the insulating layer 604 at the bendable region is etched away by using a first mask to form a first trench PB1. The first mask may be the first conventional mask as shown in FIG. 2, or may be the mask having the protrusions according to any embodiment of the present disclosure, e.g., the mask shown in FIG. 4. Specifically, the first trench PB1 is formed in the insulating layer 604 by a photolithography process. Firstly, a photoresist may be coated on the insulating layer. When a positive photoresist is used, the first region and the second region of the mask are lightproof, whereas the third region of the mask is light transmissive, such that after light irradiation, the photoresist on the third region is denatured and removed in development. Then, the exposed portion of the insulating layer is etched to form the first trench. Finally, the remaining photoresist is removed. When a negative photoresist is used, the first and second regions of the mask are light transmissive, whereas the third region of the mask is lightproof, such that the photoresist on the third region is removed in development after light irradiation. Similarly, the exposed portion of the insulating layer is then etched to form the first trench, and finally, the remaining photoresist is removed.

Figure 6D:
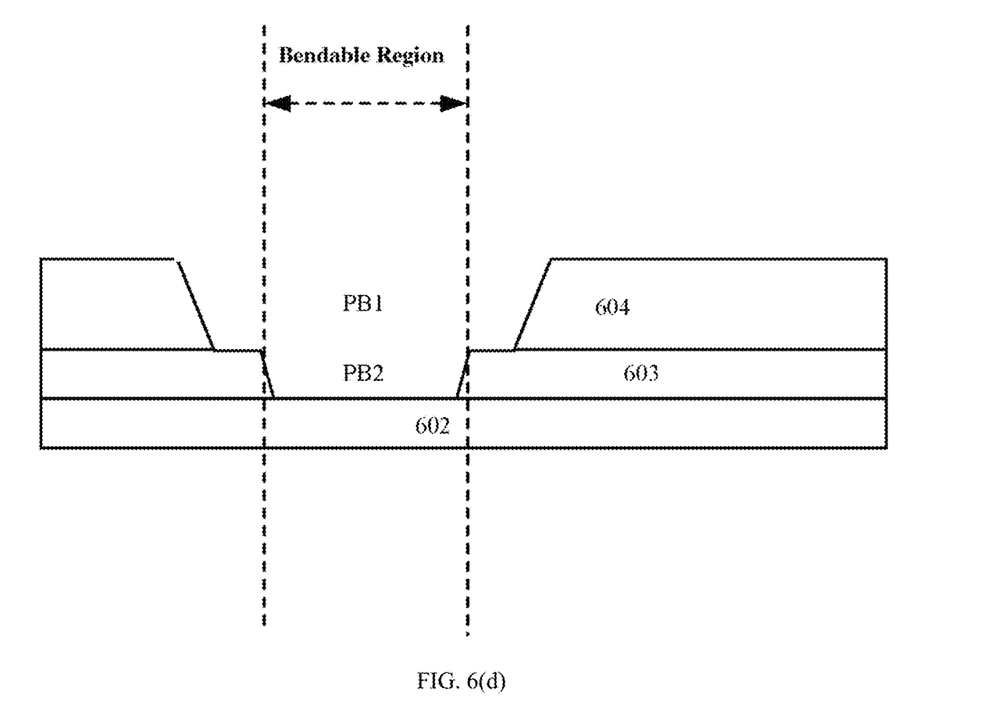

Then, at step S504, as shown in FIG. 6(d), a portion of the buffer layer 603 in the formed first trench PB1 is etched away by using a second mask to form a second trench PB2. In particular, in an embodiment of the present disclosure, at least one of the first mask and the second mask is the mask as shown in FIG. 4. For example, in some embodiments, the first mask is the first conventional mask M1 as shown in FIG. 2, and the second mask is the mask provided by the present disclosure as shown in FIG. 4. In still other embodiments, the first mask is the mask provided by the present disclosure as shown in FIG. 4, and the second mask is the second conventional mask M2 as shown in FIG. 2. In still further embodiments, each of the first and second masks is the mask as provided by the present disclosure as shown in FIG. 4.

Figure 6E:
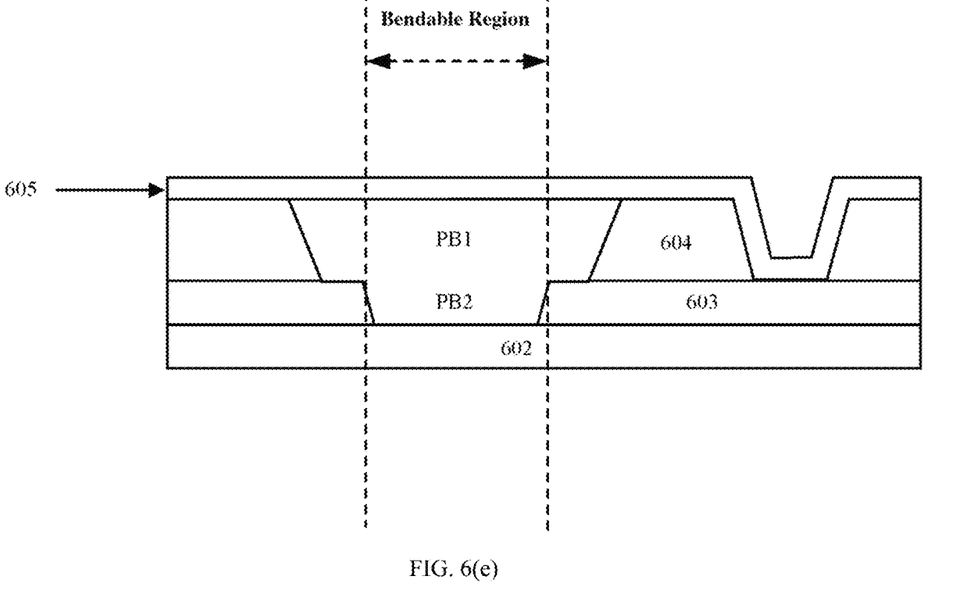

Then, at step S505, as shown in FIG. 6(e), a source-drain metal layer 605 is formed on the insulating layer 604, and the source-drain metal layer 605 covers the first trench PB1 and the second trench PB2. Thereafter, the source-drain metal layer 605 is patterned to form the data lines of the flexible display panel.

When the mask provided by any one of the embodiments of the disclosure is adopted to form the trench(es) in the bendable region of the flexible display panel, the slope angle of the formed step is far smaller than 60° due to the presence of the protrusions, and thus even if the source-drain metal material is remained on the step of the trenches after being patterned, the remained source-drain metal material is disconnected at a corner of the step because the slope angle of the step is far smaller than 60°, thereby avoiding short-circuit between adjacent data lines due to the source-drain metal residue, and improving the display effect of the display panel.

Figure 7A:
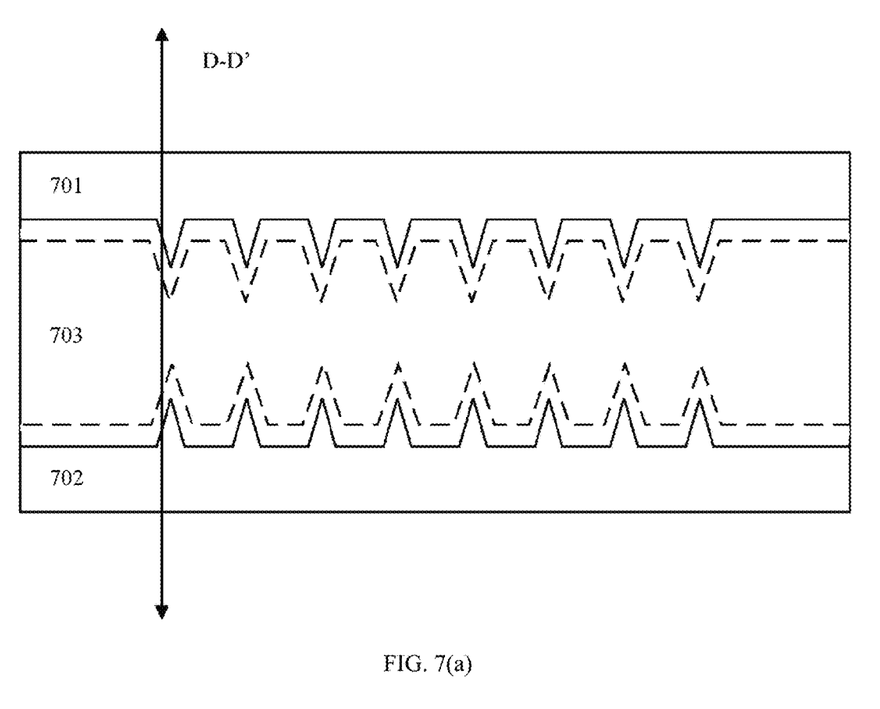
FIGS. 7(a) and 7(b) schematically illustrate a top view and side view, respectively, of a combination of a first mask and a second mask, according to embodiments of the disclosure.
Figure 7B:
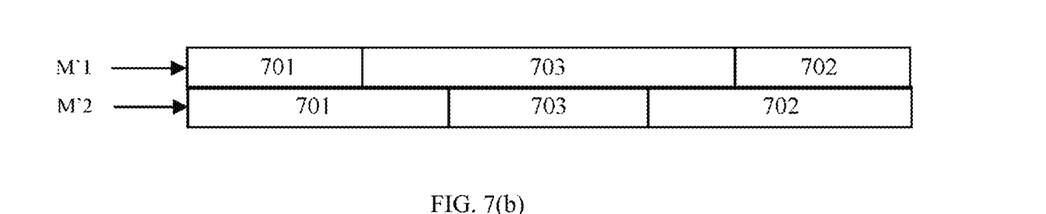

In the above embodiments, the finally formed trench is formed by two photolithography processes, in which the first mask is used in the first photolithography process for forming the larger first trench, and the second mask is used in the second photolithography process for forming the narrower second trench at a position corresponding to the first trench. A size in the first direction of a surface of the first trench proximal to the second trench is larger than a size in the first direction of a surface of the second trench proximal to the first trench, such that a step is formed at a junction of the first trench and the second trench. A slope angle of the formed step is far smaller than 60° due to the presence of the protrusions of the first mask and/or the second mask, and thus even if the source-drain metal material is remained on the step of the trenches after being patterned, the remained source-drain metal material is disconnected at a corner of the step because the slope angle of the step is far smaller than 60°, thereby avoiding short-circuit between adjacent data lines due to the source-drain metal residue, and improving the display effect of the display panel Exemplarily, when the first trench and the second trench are formed, the mask according to any one of the embodiments of the present disclosure may be used. For example, FIGS. 7(a) and 7(b) illustrate a top view and a side view of a first mask M'1 and a second mask M'2, which may be used in the method as illustrated in FIG. 5 and are arranged in a stacked state, respectively, and each of the first mask M'1 and the second mask M'2 is the mask according to the embodiment of the present disclosure as illustrated in FIG. 4. As shown in FIG. 7(a), in photolithography processes using the first mask M'1 and the second mask M'2, respectively, when a positive photoresist is used, in order to ensure that in the first direction, the minimum size of the first trench is larger than the maximum size of the second trench and the slope angle of the step formed at the junction of the first trench and the second trench is much smaller than 60°, an orthographic projection of each protrusion of the first mask M'1 on the second mask M'2 should fall within a corresponding protrusion of the second mask M'2. In this case, the first and second regions 701 and 702 of each of the first and second masks M'1 and M'2 are lightproof, whereas the third region 703 of each of the first and second masks M'1 and M'2 is light transmissive.

In contrast, when a negative photoresist is used, in order to ensure that in the first direction, the minimum size of the first trench is larger than the maximum size of the second trench and the slope angle of the step formed at the junction of the first trench and the second trench is much smaller than 60°, an orthographic projection of each protrusion of the second mask on the first mask should fall within a corresponding protrusion of the first mask. In this case, the first and second regions of each of the first and second masks are light transmissive, whereas the third region of each of the first and second masks is lightproof.

Figure 8:
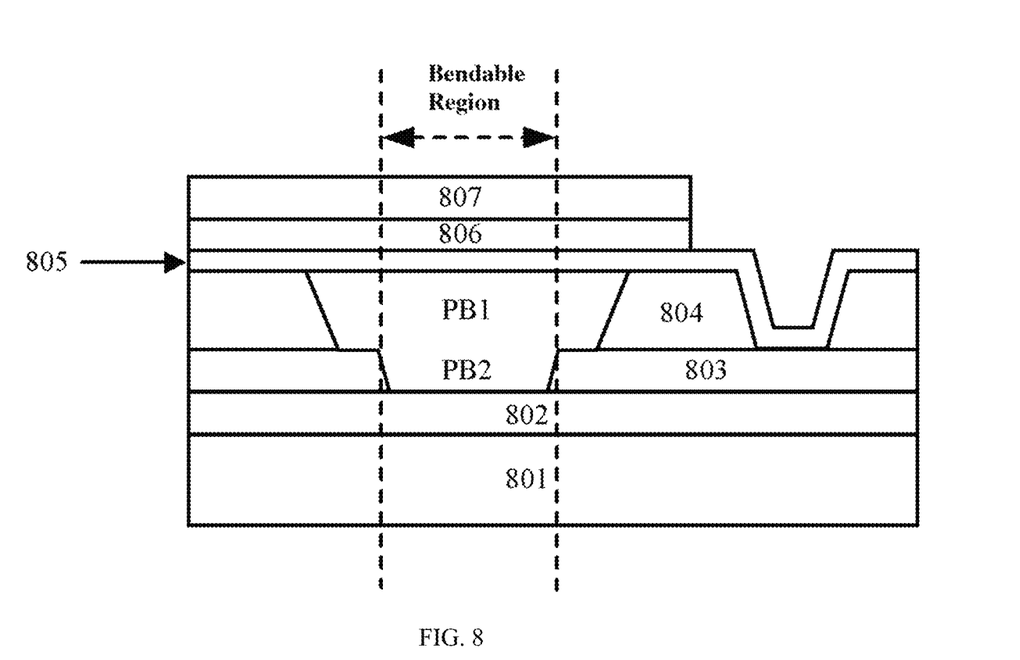
FIG. 8 schematically illustrates a cross-sectional view of a flexible display panel according to an embodiment of the present disclosure.

Embodiments of the present disclosure further provide a flexible display panel manufactured by using the above method, and the flexible display panel includes a plurality of data lines extending in a certain direction. As shown in FIG. 8, the flexible display panel includes a base substrate 802. In order to achieve flexibility of the display panel, the base substrate 802 may be made of a flexible material such as polyimide, and in order to ensure that the base substrate 802 has a sufficient support strength, the base substrate 802 may be made of multiple layers of polyimide. A buffer layer 803 and an insulating layer 804 are sequentially provided on the base substrate 802. A first trench PB1 is formed in the insulating layer 804, a second trench PB2 is formed in the buffer layer 803, and positions of the first trench PB1 and the second trench PB2 correspond to a bendable region of the flexible display panel. As shown in FIG. 8, in a direction along which the data lines of the flexible display panel extend, the minimum size of the first trench PB1 is larger than the maximum size of the second trench PB2, thereby forming a step between the first trench PB1 and the second trench PB2. A source-drain metal layer 805 is disposed on the insulating layer 804, and the source-drain metal layer 805 covers the first trench PB1.

Further, the flexible display panel may further include a protection layer 801 located on a side of the base substrate 802 distal to the buffer layer 803, a planarization layer 806 located on a side of the source-drain metal layer 805 distal to the insulating layer 804, and an encapsulation layer 807 located on a side of the planarization layer 806 distal to the source-drain metal layer 805.

In the flexible display panel, the slope angle of the formed step is much smaller than 60° due to the presence of the protrusions of the employed mask, and thus even if the source-drain metal material is remained on the step of the trenches after being patterned, the remained source-drain metal material is disconnected at a corner of the step because the slope angle of the step is much smaller than 60°, thereby avoiding short-circuit between adjacent data lines due to the source-drain metal residue, and improving the display effect of the display panel.

The present inventive concept may be widely applied to various flexible electronic systems having a display function, such as a mobile phone, a notebook computer, a liquid crystal television, and the like.

Unless defined otherwise, technical or scientific terms used herein shall have the ordinary meaning as understood by one of ordinary skill in the art to which the present disclosure belongs. The terms of "first", "second", and the like used in the present disclosure are not intended to indicate any order, quantity, or importance, but rather are used for distinguishing one element from another. Further, the term "a", "an", "the", or the like does not denote a limitation of quantity, but rather denote the presence of at least one. The word "comprising", "including", or the like, means that the element or item preceding the word contains the element or item listed after the word and its equivalent, but does not exclude the presence of other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of the object being described is changed, the relative positional relationships may also be changed accordingly. It should be noted that the features of the above embodiments may be combined with each other in any form in a case of no explicit conflict.

The foregoing descriptions are only exemplary embodiments of the present disclosure, but the scope of the present disclosure is not limited thereto. Any changes or substitutions that may be easily conceived by one of ordinary skill in the art within the technical scope of the present disclosure should be considered as falling within the scope of the present disclosure. Therefore, the protection scope of the present disclosure should be defined by the appended claims.

What is claimed is:

1. A method for manufacturing a flexible display panel, the flexible display panel comprising a display region and a flexible bendable region outside the display region, the method comprising:

forming a buffer layer on a substrate;

forming an insulating layer on a side of the buffer layer distal to the substrate;

etching a portion of the insulating layer away in the flexible bendable region by using a first mask to form a first trench;

etching a portion of the buffer layer away in the first trench by using a second mask to form a second trench; and forming a source-drain metal layer on a side of the insulating layer distal to the buffer layer, the source-drain metal layer covering the first trench and the second trench, wherein a size in a first direction of a surface of the first trench proximal to the second trench is larger than a size in the first direction of a surface of the second trench proximal to the first trench, a step is formed at a junction of the first trench and the second trench, and a slope angle of the step is smaller than 60°;

wherein at least one of the first mask and the second mask is a mask configured to form a trench in the flexible bendable region of the flexible display panel, the mask comprising a first region, a second region, and a third region between the first region and the second region in the first direction, the third region having a same pattern as a pattern of a trench to be formed, wherein the first region and the second region are lightproof whereas the third region is light transmissive, or the first region and the second region are light transmissive whereas the third region is lightproof, and an edge of at least one of the first region and the second region proximal to the third region has a plurality of protrusions, and each of the plurality of protrusions has a vertex angle that is at a side proximal to the third region and is not more than 90°.

2. A method for manufacturing a flexible display panel, the flexible display panel comprising a display region and a flexible bendable region outside the display region, the method comprising:

forming a buffer layer on a substrate;

forming an insulating layer on a side of the buffer layer distal to the substrate;

etching a portion of the insulating layer away in the flexible bendable region by using a first mask to form a first trench;

etching a portion of the buffer layer away in the first trench by using a second mask to form a second trench; and forming a source-drain metal layer on a side of the insulating layer distal to the buffer layer, the source-drain metal layer covering the first trench and the second trench, wherein a size in a first direction of a surface of the first trench proximal to the second trench is larger than a size in the first direction of a surface of the second trench proximal to the first trench, a step is formed at a junction of the first trench and the second trench, and a slope angle of the step is smaller than 60°;

wherein each of the first mask and the second mask is a mask configured to form a trench in the flexible bendable region of the flexible display panel, the mask comprising a first region, a second region, and a third region between the first region and the second region in the first direction, the third region having a same pattern as a pattern of a trench to be formed, wherein the first region and the second region are lightproof whereas the third region is light transmissive, or the first region and the second region are light transmissive whereas the third region is lightproof, an edge of at least one of the first region and the second region proximal to the third region has a plurality of protrusions, and each of the plurality of protrusions has a vertex angle that is at a side proximal to the third region and is not more than 90°, and a size of the third region of the first mask in the first direction is greater than a size of the third region of the second mask in the first direction.

3. The method according to claim 2, wherein in the first direction, a minimum size of the first trench is greater than a maximum size of the second trench.

4. A flexible display panel, manufactured by using the method according to claim 1, wherein the flexible display panel comprises a display region and a flexible bendable region outside the display region, and the flexible display panel comprises:

a substrate;

a buffer layer on the substrate;

an insulating layer on a side of the buffer layer distal to the substrate;

a first trench in the insulating layer and in the flexible bendable region; and a second trench in the buffer layer and in the first trench, wherein a size in a first direction of a surface of the first trench proximal to the second trench is larger than a size in the first direction of a surface of the second trench proximal to the first trench, a step is formed at a junction of the first trench and the second trench, and a slope angle of the step is smaller than 60°.

5. The flexible display panel according to claim 4, wherein in the first direction, a minimum size of the first trench is greater than a maximum size of the second trench.

6. The method according to claim 1, wherein a shape of each of the plurality of protrusions is a triangle.

7. The method according to claim 1, wherein a size of each of the plurality of protrusions in the first direction is not more than 10 microns.

8. The method according to claim 1, wherein the flexible display panel has a plurality of data lines extending along the first direction, and a maximum size of each of the plurality of protrusions in a second direction perpendicular to the first direction is not greater than a distance between adjacent two of the plurality of data lines.

9. The method according to claim 1, wherein the edge of each of the first region and the second region proximal to the third region has the plurality of protrusions, and each protrusion of the first region and a corresponding protrusion of the second region are exactly opposite to each other in the first direction.

10. The method according to claim 2, wherein a shape of each of the plurality of protrusions is a triangle.

11. The method according to claim 2, wherein a size of each of the plurality of protrusions in the first direction is not more than 10 microns.

12. The method according to claim 2, wherein the flexible display panel has a plurality of data lines extending along the first direction, and a maximum size of each of the plurality of protrusions in a second direction perpendicular to the first direction is not greater than a distance between adjacent two of the plurality of data lines.

13. The method according to claim 2, wherein the edge of each of the first region and the second region proximal to the third region has the plurality of protrusions, and each protrusion of the first region and a corresponding protrusion of the second region are exactly opposite to each other in the first direction.

* * * * *